April 28, 1970 V. GIUDICI 3,509,493

LOW LOSS STARTING DEVICE FOR INVERTERS

Filed July 17, 1968

INVENTOR
VITTORIO GIUDICI

BY Glenn H. Antrim

ATTY.

3,509,493

LOW LOSS STARTING DEVICE FOR INVERTERS

Vittorio Giudici, Milan, Italy, assignor to Automatic Electric Laboratories, Inc., Northlake, Ill., a corporation of Delaware Filed July 17, 1968, Ser. No. 745,424
Int. Cl. H02m 3/32

U.S. Cl. 331—113 3 Claims

ABSTRACT OF THE DISCLOSURE

A transistor and two resistors comprise a low-loss starting circuit in an inverter of the multivibratory type. The multivibrator may use two transistors, or it may use four transistors in a bridge arrangement. In either arrangement, the collector-emitter circuit of the transistor in the starting circuit conducts base-to-emitter current for one of the transistors of the multivibrator to start oscillation. The base and the collector of the transistor in the starting circuit are connected to different collector circuits of the inverter such that after oscillation has started, circuits originally applying voltage to the base and the collector of the starting transistor are alternately shunted by low-impedance switching circuits provided by the transistors of the inverters. The voltage is therefore normally removed from either the base or the collector of the transistor in the starting circuit so that its collector-to-emitter circuit is nonconductive after oscillation starts.

In inverters of the bridge type, an additional transistor circuit is required. The collector-emitter circuit of this transistor connects the source of power to a center tap especially provided on an output transformer for use only during the starting interval. The additional transistor is conductive only during the starting period to complete a current path in the starting circuit.

BACKGROUND OF THE INVENTION

This invention relates to transistor oscillators of the multivibrator type and particularly to starting circuits for inverters which operate efficiently to convert power from a direct-current source to alternating-current power.

Certain prior inverters use diodes and series resistors in starting circuits to cause initial current flow in particular transistors of multivibrator circuits. After this flow of current starts oscillation, the strating circuits continue to dissipate substantial power and therefore cause a drain on the direct-current sources of power. Other circuits use capacitors in a starting circuit and may use a minimum amount of power, but these starting circuits fail to start oscillation when power from the direct-current source is applied gradually.

Additional components may be used in a low-loss starting circuit such as shown in U.S. Patent 3,160,830 issued to D. F. Murphy on Dec. 8, 1964, to obtain both positive starting and low-loss of power after starting. Both transistors and diode are used. The transistors of the starting circuit supply starting bias current to transistors of an oscillator; the diodes are in a bias circuit of the starting transistors. After the oscillator starts, alternating current from a winding on a transformer of the oscillator is applied to the bias circuit in which the diodes rectify the voltage for application to the bases of starting transistors. Rectified voltage from the diodes cut-off the collector current of the transistors of the starting circuit.

SUMMARY OF THE INVENTION

The starting circuit of this invention is simple and inexpensive, but still has the advantage of positive starting and low power dissipation. Only a transistor and two resistors are necessary for incorporation in a converter circuit of the well known multivibrator type. The starting circuit provides starting current to a transistor of a multivibrator, and the transistor of the starting circuit is then made nonconductive while the multivibrator is operating. Therefore, during the operation of the multivibrator, the amount of power absorbed by the starting is negligible. The starting circuit is effective whether power for the multivibrator is applied gradually or abruptly. The collector-emitter circuit of the transistor in the starting circuit is nonconductive after starting because its base and its collector are connected to different outer terminals of the primary winding of the transformer such that voltage is absent on either the base or the collector according to which terminal of the transformer is connected through a respective conductive transistor to a particular terminal of the source voltage.

When a bridge-type multivibrator is used, the starting circuit also includes a transistor connected between the source of the direct-current power and a center tap of a primary winding of an output transformer. The collector-to-emitter circuit of this transistor is conductive only during the starting interval. Its base is biased at one-half the voltage of the direct-current source, and after starting, the emitter connected to the center tap of the transformer is also at the same voltage.

DESCRIPTION OF THE PREFERRED EMBODIMENT

Figure 1:
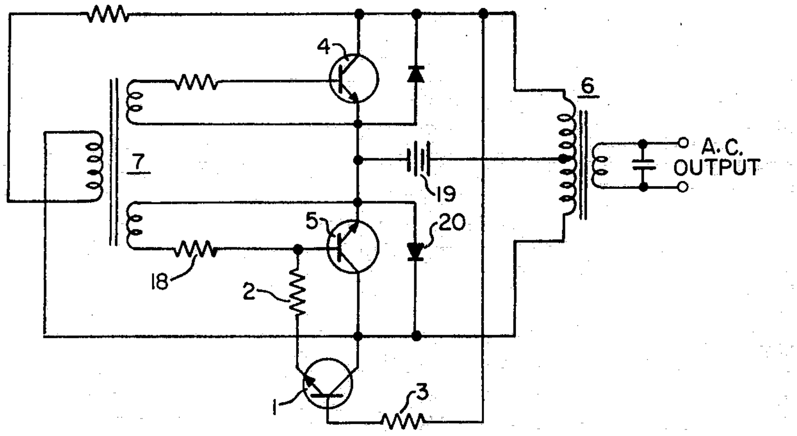
FIG. 1 is a schematic diagram of a two-transistor multivibrator or converter using the starting circuit of this invention.
Figure 2:
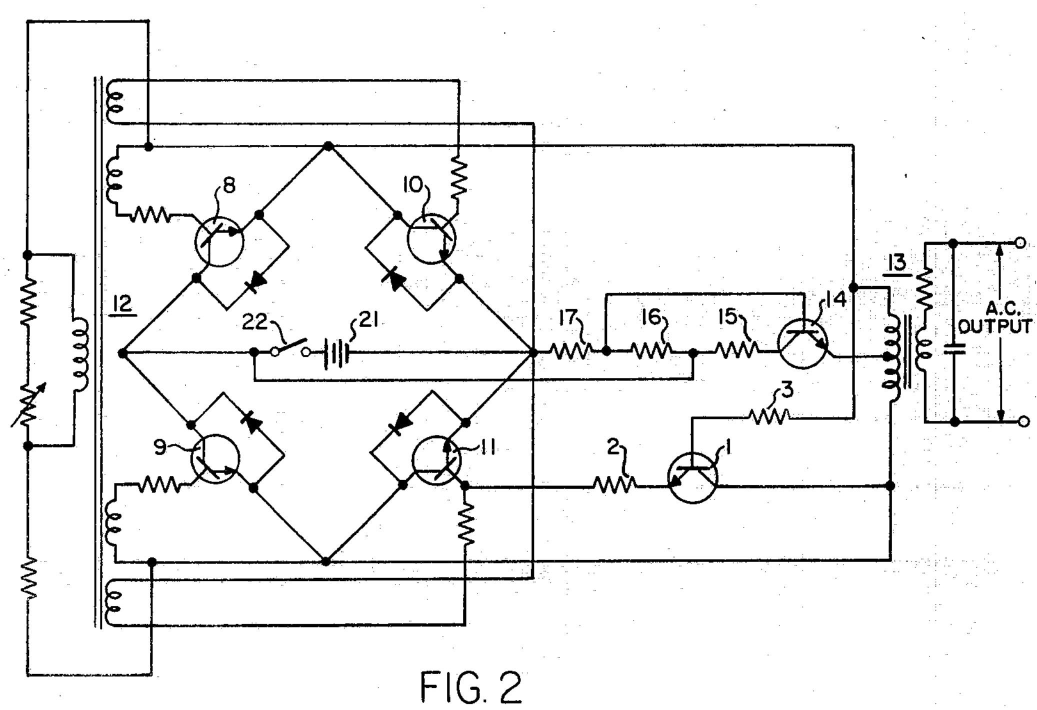
FIG. 2 is a schematic diagram of a four-transistor converter in a bridge arrangement using both the starting circuit shown in FIG. 1 and an additional starting transistor.

As shown in the accompanying FIG. 1, the starting circuit comprising a transistor 1 and resistors 2 and 3, is used in conjunction with an inverter of the known multivibrator type. The inverter includes two transistors 4 and 5, output transformer 6, and switching transformer 7. The starting circuit is applicable to other types of inverters, particularly to inverters of the type which use four transistors 8–11 in a bridge arrangement as shown in FIG. 2. In FIG. 2, a switching transformer 12 has additional windings for the two additional transistors. Usually in a bridge arrangement, a center tap is not used on the primary winding of an output transformer 13, but it is required in a starting circuit in this embodiment.

In FIG. 2, the starting circuit includes an additional transistor 14, a current limiting resistor 15, and two resistors 16 and 17 connected in a voltage divider circuit for biasing the base of the transistor 14. When power is first applied to the multivibrator, a conductive path in FIG. 1 is completed through the collector-emitter circuit of the transistor 1 and the base-emitter circuit of the transistor 5 of the multivibrator to ensure start of oscillation. In FIG. 2, an initial conductive path is completed through the collector-emitter circuits of the transistors 1 and 14 and the base-emitter circuit of the transistor 11.

Since the multivibrator type inverter is well known, its circuit and operation are described only briefly. In FIG. 1, the base, which is the input circuit, of each of the type NPN transistors 4 and 5 of the multivibrator is transformer coupled to the output transformer 6; the voltage from the output being fed back in proper phase to sustain oscillation. In the circuit as illustrated, a separate switching transformer 7 has its primary winding connected in parallel with the primary winding of the output transformer 6 and has its secondary windings connected to the input circuits of respective transistors. For example, one terminal of a secondary winding of the transformer 7 is connected through a current limiting resistor 18 to the base of the respective type NPN transistor 5, and the other terminal of this winding is connected to the emitter of the same transistor, the emitter also being connected to the negative terminal of a source of direct current power 19. The diodes corresponding to a diode 20 which is connected between the emitter and the collector of the transistor 5 provide a path for current caused by reactive loads while the respective transistors are normally nonconductive and the direction of current flow is opposite the normal direction.

The embodiment of FIG. 2 has transistors 8–11 connected in a usual bridge arrangement so that the current flow during each half cycle of operation flows through the full primary winding of an output transformer 13. The center tap of the primary winding of the transformer 13 is usually not required in a bridge type circuit, but is employed in the circuit of FIG. 2 as part of the starting circuit. The base of each of the transistors 8–11 of the multivibrator is transformer coupled to the output transformer 13; the voltage from the output being fed back in proper phase to sustain oscillation. As in the circuit of FIG. 1, a separate switching transformer 12 has its primary winding connected in parallel with the primary winding of the output transformer 13. The secondary winding of the output transformer 13 is connected to terminals for supplying power to an external load.

The starting circuits, which are described in detail below, can be more readily understood after tracing usual paths of current flow existing in inverters after they have been started. In FIG. 1, when voltage at the switching transformer 7 is in the proper polarity to cause the transistor 5 to become conductive, current flow may be traced from the positive terminal of the source 19, through one-half the primary winding of the transformer 6 and the collector-emitter circuit of the transistor 5 to the negative terminal of the source 19. During alternate half-cycles when the transistor 4 is conductive, current flows from the positive terminal of the source 19 through the other half of the primary winding of the transformer 6 and the emitter collector circuit of the transistor 4 to the negative terminal of the source 19.

In FIG. 2 current does not normally flow through the center tap of the primary winding of the output transformer 13. When voltage from the switching transformer 12 is in proper polarity to cause the transistors 8 and 11 to become conductive, current flow may be traced from the positive terminal of the source 21, through a switch 22, the collector-emitter circuit of the transistor 8, the primary winding of the transformer 13, the collector-emitter circuit of the transistor 11 to the negative terminal of the source 21. During alternate half-cycles when the transistors 9 and 10 are conductive, current flows through the primary winding of the transformer 8 in an opposite direction as follows: positive terminal of the source 21, the switch 22, the collector-emitter circuit of the transistor 9, the primary winding of the transformer 13, the collector-emitter circuit of the transistor 10 to the negative terminal of the source 21.

The starting circuit of a multivibrator of the type shown in FIG. 1 or the bridge type as shown in FIG. 2 comprises the transistor 1 and the resistors 2 and 3. The transistor 1 is shown as type NPN, but a type PNP may be required if type PNP transistors are used in the multivibrator. In FIG. 1, the emitter of the transistor 1 is connected through the resistor 2 to the base of the transistor 5; the collector of the transistor 1 is connected to the outer terminal of the primary winding of the transformer 6 which is also connected to the collector of the transistor 5; and the base of the transistor 1 is connected through the resistor 3 to that outer terminal on the opposite side of the center tap of the primary winding of the transformer 6. In the bridge type circuit of FIG. 2, the starting circuit is connected in a similar arrangement.

The emitter of the transistor 1 is connected through the resistor 2 to the base of the transistor 11; the collector of the transistor 1 is connected to that outer terminal of the primary winding of the transformer 13 which is also connected to the collector of the transistor 11; and the base of the transistor 1 is connected through the resistor 3 to the opposite outer terminal of the primary winding of the transformer 13.

Another transistor 14 is used in the starting circuit of a bridge type arrangement as shown in FIG. 2. The positive terminal of the source or battery 21 is connected through the resistor 15 to the collector of the transistor 14, and the emitter is connected to the center tap of the primary winding of the transformer 13. The base of the transistor 14 is connected to the junction of the serially connected resistors 16 and 17. These resistors of equal value are connected in series across the source 21 and function as a voltage divider to provide bias to the base of the transistor 14.

The starting circuit of either FIG. 1 or FIG. 2 biases a transistor to which the starting circuit is connected so that it is conductive immediately after power is supplied to the multivibrator from a direct-current source. In FIG. 1 the starting circuit can be traced from the positive terminal of the source 19 through one-half the primary winding of the output transformer 6, the collector-emitter circuit of the transistor 1, the resistor 2, and the base-emitter circuit of the multivibrator transistor 5 to the negative terminal of the source 19. The collector-emitter circuit of the transistor 5 is thereby made conductive to cause substantial current flow through the lower one-half winding of the output transformer 6, and to cause sufficient change in current in the switching transformer 7 to start oscillation. When voltage is applied gradually, the transistor 5 will start to function in the same manner as a class A feedback oscillator to induce normal multivibrator operation.

In the bridge-type circuit of FIG. 2, the path for the starting current immediately after the switch 17 is closed, can be traced from the positive terminal of the direct-current source 21, through switch 22, the resistor 15, the collector-emitter circuit of the transistor 14, the lower one-half of the primary winding of the transformer 13, the collector-emitter circuit of the transistor 1, the resistor 2, the base-emitter circuit of the multivibrator transistor 11 to the negative terminal of the source 21.

As the inverters start, current flow in the starting circuits decreases until the power dissipated in these circuits is small. In FIG. 1, when the transistor 5 is nonconductive and the transistor 4 is conductive, voltage exists between the collector and the emitter of the transistor 1. The current flow in the starting circuit is low because the base-to-emitter voltage of the transistor 1 is small while the transistor 4 is conductive and provides low impedance from the negative terminal of the source to the resistor 3 of the starting circuit. During the next half-cycle of operation while the transistor 5 is conductive, the voltage applied between the collector and the emitter of transistor 1 is low so that the collector current is negligible. During this half cycle, voltage which is nearly twice the voltage of the source 19 exists between the emitter-base circuit which includes the resistors 2 and 3. These resistors dissipate only a moderate amount of power because the resistance of the resistor 3 is relatively high. Where even less dissipation in the starting circuit is required, an additional transistor connected in a Darlington arrangement, for example, may be used in conjunction with the transistor 1 so that a resistor of still higher value may be used in place of the resistor 3 for applying bias voltage to the starting circuit.

Likewise, in FIG. 2 when the transistors 8 and 11 are nonconductive and the transistors 9 and 10 are conductive, the base-to-emitter voltage of the transistor 1 is small while the transistor 10 provides low impedance from the negative terminal source to the resistor 3 of the starting circuit. During the next half-cycle of operation, the voltage applied between the collector and emitter of the transistor 1 is low because of the low impedance offered across this circuit by the conductive transistor 11.

The additional transistor 14 shown in FIG. 2 becomes nonconductive as the inverters start, because voltage no longer exists between the base and the emitter of this transistor. The resistors 15 and 16 for biasing the base of the transistor 14 are equal in value and therefore apply one-half of the voltage of the direct-current source 21 to the base. Since the emitter of the transistor 14 is connected to the center tap of the primary winding of the transformer 13, the emitter is also maintained at one-half the voltage of the source 21 after the inverter starts. By replacing the transistor 14 with two transistors connected in a Darlington circuit, the value of the resistors corresponding to the resistors 16 and 17 can be higher than the value of the resistors 16 and 17 connected in a circuit as shown so that power loss can be still smaller.

What is claimed is:

1. In an inverter of the multivibrator type including transformer means having a primary winding and a secondary winding, at least first and second transistors each having a collector-emitter output circuit and an emitter-base control circuit, said secondary winding providing alternating-current voltage for an output load, direct-current supply means connected to the collector-emitter circuits of said transistors, said primary winding having first and second terminals connected to the collector-emitter circuits of said first and second transistors, respectively, so that said primary winding is connected through said collector-emitter circuits to said direct-current supply means, and means coupling said emitter-base circuits to said primary winding to apply feedback-voltage to said emitter-base circuits in proper polarity to sustain oscillation;

a starting circuit including a third transistor and first and second resistors, said third transistor having a collector-emitter circuit and an emitter-base circuit, said direct-current supply means being connected in series with at least a portion of the primary winding of said transformer means, the collector-emitter circuits of said third transistor, said first resistor and the emitter-base circuit of said first transistor in an arrangement such that said collector-emitter circuit of said third transistor is connected to said first terminal of said primary winding of said transformer, and said second terminal of said primary winding is connected as a bias circuit through said second resistor to the emitter-base circuit of said third transistor, whereby during operation of said inverter, said collector-emitter circuit and said emitter-base circuit of said third transistor have such low voltage applied thereto during respective alternate one-half periods of oscillation of said inverter that the collector-emitter circuit of said third transistor is maintained nonconductive.

2. In an inverter having an output transformer and at least four transistors, each having a collector-emitter circuit and an emitter-base circuit, said collector-emitter circuits being connected in a bridge arrangement, said transformer having a secondary winding providing alternating-current voltage for a load, and a primary winding having first and second outer terminals, said first and second outer terminals being connected between respective terminals of one diagonal of said bridge arrangement, a source of direct current connected across the other diagonal, and means coupling said emitter-base circuits to said primary winding to apply feedback voltage to said emitter-base circuits in proper polarity to sustain oscillation;

a starting circuit including a fifth transistor and first and second resistors, said fifth transistor having a collector-emitter circuit and an emitter-base circuit, said primary winding having a center tap, means connecting said center tap to said source of direct current, said collector-emitter circuit of said fifth transistor connected in series with said first resistor between said first outer terminal of said primary winding and the emitter-base circuit of one of said four transistors having its collector-emitter circuit also connected to said first outer terminal, and said emitter-base circuit of said fifth transistor being connected in a bias circuit through said second resistor to said second outer terminal of said primary winding.

3. In an inverter including a starting circuit as claimed in claim 2 in which said means connecting said center tap of said primary winding to said source of direct current comprises a sixth transistor and a third resistor, said sixth transistor having a collector-emitter circuit and an emitter-base circuit, said third resistor and said last-mentioned collector-emitter circuit being connected between said center tap and said source, a voltage divider connected across said source of direct current, and the midpoint of said voltage divider being connected as a bias circuit to said last-mentioned emitter-base circuit.

References Cited

UNITED STATES PATENTS

| | | | |
|---|---|---|---|
| 2,922,958 | 1/1960 | Dean | 331—113 |
| 3,444,481 | 5/1969 | Fisher | 331—113 |

JOHN KOMINSKI, Primary Examiner

U.S. Cl. X.R.

331—110